(12) United States Patent
Miyajima

(10) Patent No.: US 6,768,154 B2
(45) Date of Patent: Jul. 27, 2004

(54) SEMICONDUCTOR DEVICE

(75) Inventor: Takashi Miyajima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/408,582

(22) Filed: Apr. 8, 2003

(65) Prior Publication Data
US 2004/0051130 A1 Mar. 18, 2004

(30) Foreign Application Priority Data
Sep. 18, 2002 (JP) .......................................... 2002-271667

(51) Int. Cl.[7] .............................................. H01L 29/72
(52) U.S. Cl. ..................... 257/301; 257/306; 257/298; 257/300
(58) Field of Search ................................ 257/298, 300, 257/301, 306

(56) References Cited

U.S. PATENT DOCUMENTS 6,146,941 A  11/2000 Huang et al.
6,369,446 B1 * 4/2002 Tanaka ........................ 257/758

FOREIGN PATENT DOCUMENTS

JP   P2002-76302 A   3/2002
JP   P2002-83880 A   3/2002

* cited by examiner

Primary Examiner—Edward Wojciechowicz
(74) Attorney, Agent, or Firm—McDermott Will & Emery LLP

(57) ABSTRACT

There is provided a semiconductor device having a storage node free of defect in geometry and capable of preventing a cylinder from collapsing, protecting an interface with an SC's polycrystalline silicon barrier metal against oxidation, and furthermore reducing current leakage. The device includes a storage node contact insulation film disposed on a semiconductor substrate and provided with a storage node, a storage node insulation film and the storage node penetrating the storage node insulation film and positioned to extend from the storage node insulation film upward, and a storage node contact is recessed toward a bottom of the storage node and the storage node's bottom has a protruding geometry embedded in the recess.

6 Claims, 17 Drawing Sheets

SEMICONDUCTOR DEVICE

BACKGROUND OF THE INVENTION

1. Field of the Invention

The present invention relates generally to semiconductor devices and particularly to semiconductor devices including a metal-insulator-metal (MIM) capacitor having a highly reliable storage node.

2. Description of the Background Art

As devices are highly integrated, chips are reduced in size and in semiconductor devices memory's capacitor is arranged at reduced intervals and also reduced in size. Developing small-size DRAMs requires a capacitor having increased capacitance. Accordingly, an electrode is formed of ruthenium (Ru), a material of metal, and as the capacitor's dielectric film a dielectric film of high permittivity such as $Ta_2O_5$ film is used in developing an MIM capacitor.

FIG. 33 is a plan view of a dynamic random access memory (DRAM) using a conventional cylindrical capacitor. FIG. 34 is a cross section taken along a line XXXIV—XXXIV of FIG. 33. This cross section is parallel to a bit line BL. In FIG. 33 on a silicon substrate 151 transfer gates TGs 101 are arranged with a predetermined pitch and bit lines BLs 102 are arranged orthogonal thereto also with a predetermined bitch. The intersecting transfer gates and bit lines form meshes each provided with landing pad of polysilicon 103. The bit line overlies a bit line contact 104.

In FIG. 34, a storage node contact (SC) interlayer insulation film 105 formed of boro-phospho tetra-ethyl-orthosilicate (BPTEOS) film is penetrated by an SC barrier metal plug 114. SC interlayer insulation film 105 underlies a storage node (SN) interlayer insulation film 7 formed of BPTEOS film and penetrated by a storage node electrode 108 and a dielectric film 109 such as $Ta_2O_5$. Furthermore, dielectric film 109 is covered with and a cylinder is also filled with a cell plate 110 of a top electrode of a capacitor. Thereon a contact interlayer insulation film 111 formed of plasma TEOS film is stacked and furthermore an aluminum interconnection 112 and a passivation film 113 are formed.

The above conventional MIM capacitor is fabricated, as described hereinafter. With reference to FIG. 35, initially as SC interlayer insulation film 105 of BPTEOS film is vapor deposited to have a thickness of 450 nm and a photoresist pattern is used as a mask to pattern the BPTEOS film. Oxide film is then dry-etched. Then as a storage node contact's (SC's) barrier metal 114 TiN film is provided through chemical vapor deposition. The TiN film is then chemically mechanically polished to obtain the SC barrier metal having a cross section, as shown in FIG. 35.

Then as an SN interlayer insulation film a SiN film 115 is vapor deposited to have a thickness of 80 nm and so is BPTEOS film 107 to have a thickness of 1200 nm. Photoresist is then used as a mask to pattern the SN interlayer insulation film. Oxide film is then dry-etched to obtain a geometry, as shown in FIG. 36, which shows that an opening is provided for forming a storage node.

Sputtering is then employed to vapor deposit Ru to have a thickness of 20 nm and chemical vapor deposition is then employed to vapor deposit Ru. Thus in an SN hole Ru film 108 is uniformly vapor deposited to form a geometry of SN electrode film 108 (FIG. 37).

Ru film 108, which will serve as an SN electrode, and SN interlayer insulation film 107 are then chemically mechanically polished. Then as dielectric film 109 tantalum oxide ($Ta_2O_5$ film) is vapor deposited to have a thickness of 12 nm and then oxidized at 400° C. in ozone ($O_3$) gas and thus crystallized.

After the oxidization in ozone, as a cell plate (CP) electrode, Ru film 110 is vapor deposited to form the CP electrode. Then as CH interlayer insulation film 111 BPTEOS film is vapor deposited and then aluminum interconnection 112 is vapor deposited and patterned (FIG. 34). Then as passivation film 113 plasma nitride film is vapor deposited to form a conventional DRAM memory cell, as shown in FIG. 34.

As has been described above, the dielectric film of high permittivity used in the capacitor needs to be oxidized by oxygen, ozone or the like. In this oxidation step, ruthenium (Ru) and other similar metals are also oxidized. However, ruthenium oxide and other similar metal oxides are conductive and the capacitor does not have its capacitance impaired.

However, ruthenium (Ru) used as a material for an electrode of a capacitor provides poor contact with oxide film. As such, (a1) when vapor deposited Ru film 8 is chemically mechanically polished the Ru film has poor contact with BPTEOS film, resulting in the film peeling off disadvantageously. Furthermore, (a2) in ozone ($O_3$) oxidization the Ru film forming SN electrode film 108 is oxidized and as a result BPTEOS film 107 forming the SN interlayer insulation film and Ru film 108 forming the SN electrode have poor contact therebetween and a gap may result. As such between the FIG. 37 condition and the FIG. 38 condition (a3) when the intermediate product is chemically mechanically polished, as described above, the cylindrical capacitor collapses. These disadvantages have been studied, as disclosed for example in Japanese Patent Laying-Open Nos. 2002-83880 and 2002-76302 and U.S. Pat. No. 6,146,941.

Furthermore as another disadvantage (a4) when ozone is used to oxidize the dielectric film an oxidizing species of the ozone reaches the TiN plug forming SC barrier metal 114. The plug is oxidized and thus has high resistance and a current leaks disadvantageously.

SUMMARY OF THE INVENTION

The present invention mainly contemplates a semiconductor device preventing a cylinder from collapsing at a bottom electrode of a capacitor in forming the capacitor. In addition the present invention in one aspect contemplates a semiconductor device capable of preventing oxidization of an interface of an SC barrier metal and a polycrystalline silicon plug and in another aspect contemplates a semiconductor device capable of reducing a current leaking from the capacitor.

In accordance with the present invention a semiconductor device includes: a first interlayer insulation film disposed on a semiconductor substrate; a second interlayer insulation film disposed on the first interlayer insulation film; and a cylindrical metal film penetrating the second interlayer insulation film, the cylindrical metal film having a bottom facing downward and exposed to the layer of the first interlayer insulation film, the cylindrical metal film having an opening, as seen downward, and extending from the second interlayer insulation film upward. Furthermore the present semiconductor device includes a storage node contact, in contact with the bottom of the cylindrical method film, disposed in the first interlayer insulation film, the storage node contact being recessed toward the bottom of the cylindrical metal film, the bottom having a protruding geometry embedded in the recess.

Thus the cylindrical metal film and the storage node contact can contact each other over an increased area to provide reduced contact resistance. Furthermore, the film and the contact that contact each other over the increased area allow the capacitor's bottom electrode and the contact to contact each other closer to prevent the bottom electrode from collapsing.

In accordance with the present invention another semiconductor device includes: a first interlayer insulation film disposed on a semiconductor substrate; a second interlayer insulation film disposed on the first interlayer insulation film; an etching stopper film disposed in contact with an upper surface of the second interlayer insulation film; a cylindrical metal film penetrating the second interlayer insulation film and the etching stopper film, the cylindrical metal film having a cylindrical bottom facing downward and an opening facing upward, the cylindrical metal film extending from the etching stopper film upward; a storage node contact, in contact with the bottom of the cylindrical metal film, disposed in the first interlayer insulation film and a dielectric film covering a cylindrical inner surface of the cylindrical metal film and an outer surface of a portion protruding from the etching stopper film, the etching stopper film being SiN film vapor deposited at no more than 400° C.

A portion lower than the etching stopper film can support the cylindrical metal film to prevent the capacitor's bottom electrode from collapsing. Furthermore, the etching stopper film that is formed at a low temperature can protect the storage node contact from further crystallization and prevent the storage node contact from having increased contact resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

With reference to the drawings the present invention in embodiments will now be described.

First Embodiment

Figure 1:
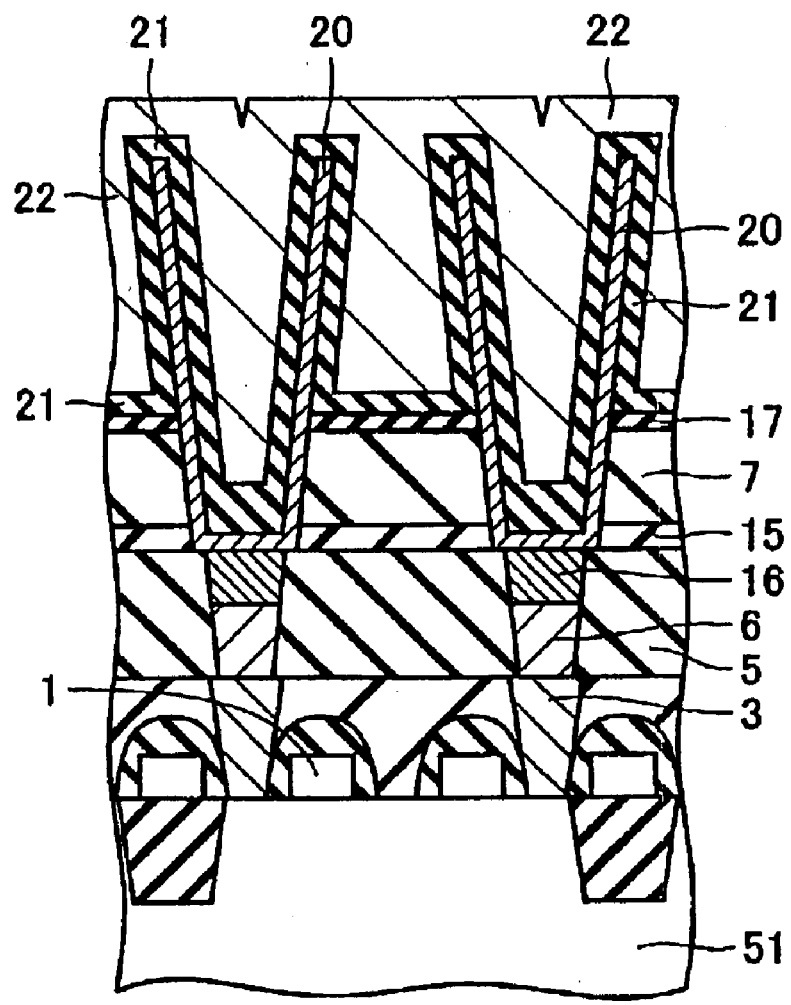
FIG. 1 is a cross section of a semiconductor device of a first embodiment of the present invention.

In FIG. 1 on a semiconductor substrate 51 a transfer gates 1 is provided and covered with an interlayer insulation film. The interlayer insulation film is penetrated by a landing pad of polysilicon 3 allowing the silicon substrate and an upper portion to electrically communicate.

On the interlayer insulation film a boro-phospho tetra-ethyl-ortho-silicate (BPTEOS) film forms an SC interlayer insulation film (a first interlayer insulation film) 5 and interlayer insulation film 5 is penetrated by storage node contact (SC) barrier metal plug 6, 16. The SC is formed to fill a first hole. An upper connection 16 is formed of a material providing good contact with an SC electrode, such as TiN and TaN, and a lower connection 6 is preferably formed of doped polycrystalline silicon.

On SC interlayer insulation film 5 a BPTEOS film is arranged to form a storage node (SN) interlayer insulation film (a second interlayer insulation film) 7. Interlayer insulation film 7 is smaller in thickness than conventional. On interlayer insulation film 7 a SiN film is provided to form a wet stopper film 17. A Ru film forming a storage node electrode 20 is positioned to have a bottom in contact with upper connection 16 and extend upper than interlayer insulation film 7 and wet stopper film 17. The storage node electrode's inner and outer surfaces and furthermore wet stopper film 17 are covered by a dielectric film 21 of $Ta_2O_5$. Furthermore, dielectric film 21 is covered with and a cylindrical opening is filled with a CP electrode 22.

Figure 2:
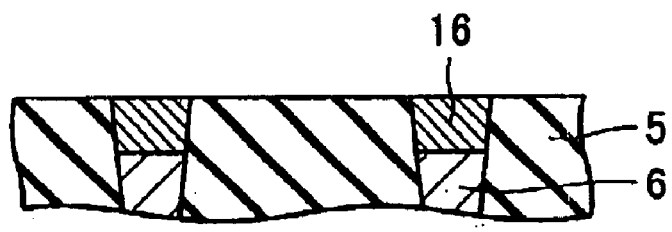
FIG. 2 shows that in production of the FIG. 1 semiconductor device an SC barrier metal is vapor deposited and chemically mechanically polished.

The present production method will now be described. With reference to FIG. 2, as SC interlayer insulation film 5 a BPTEOS film is vapor deposited to have a thickness of 450 nm and a resist pattern is used as a mask to pattern the BPTEOS film. Then, dry etching is employed to etch an oxide film of an SC hole (a first hole). Then, doped polysilicon is vapor deposited to have a thickness of 200 nm and then etched back and thus recessed by 100 nm to form an SC polycrystalline silicon plug 6. Then as an SC barrier metal 16 a film formed of TiN/Ti stacked is deposited through chemical vapor deposition and this interlayer structure film is then chemically mechanically polished. FIG. 2 shows the SC barrier metal having been chemically mechanically polished.

Figure 3:
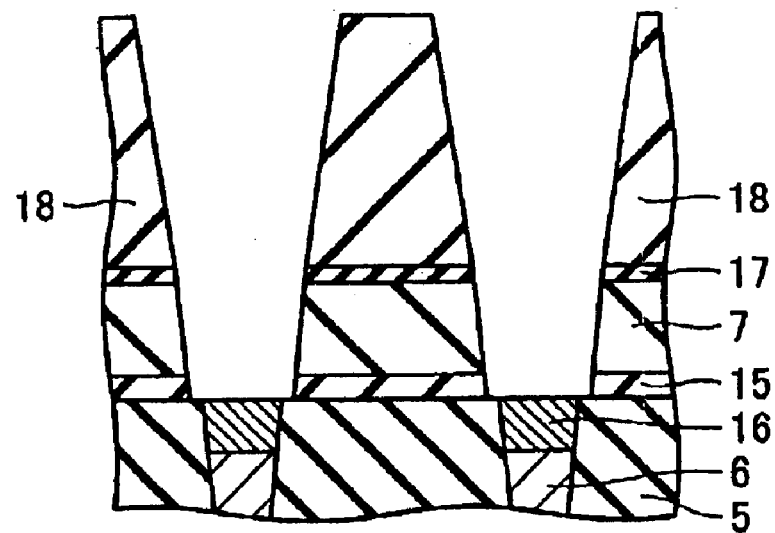
FIG. 3 shows that an SiN film, an SN interlayer insulation film, a wet stopper film and a BPTEOS film are vapor deposited and an SN hole is then provided.

Then, with reference FIG. 3, as SN interlayer insulation film (the second interlayer insulation film) 7 a BPTEOS film is vapor deposited to have a thickness of 400 nm and then as wet stopper film 17 a SiN film is vapor deposited at no more than 400° C. to have a thickness of 15 nm. Thus forming a SiN film at a low temperature can protect the SC barrier metal from further crystallization. Thereafter on wet stopper film 17 BPTEOS film 18 is vapor deposited to have a thickness of 800 nm and a photoresist pattern is used as a mask to pattern SN interlayer insulation film 7, wet stopper film 17 and BPTEOS film 18. Wet stopper film 17 is not limited to SiN film and it may for example be polysilicon film, TiN film, or TaN film. Then an oxide film is dry etched to form an opening (a second hole) for the SN. FIG. 3 shows that the opening for the SN has been provided.

Figure 4:
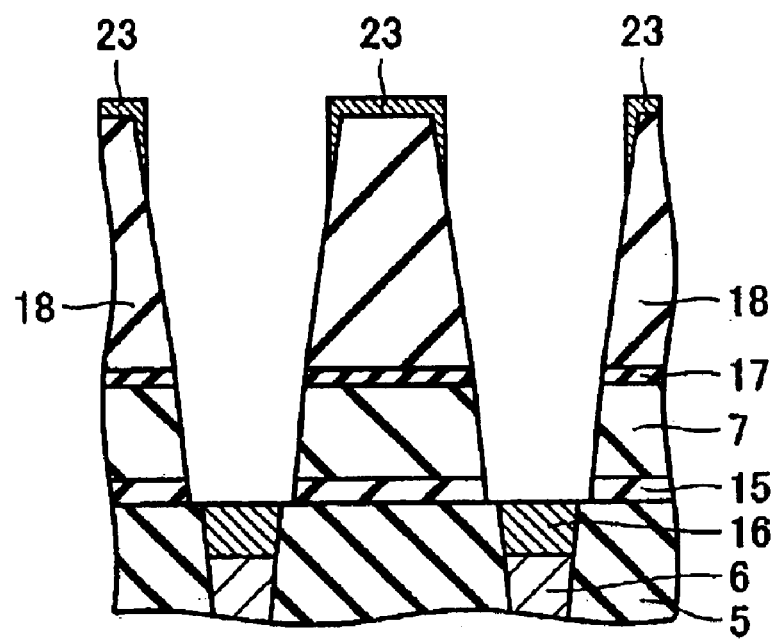
FIG. 4 shows that on the BPTEOS film TiN film has been sputtered.

Then, with reference to FIG. 4, sputtering is employed to vapor deposit a TiN film 23 to have a thickness of 20 nm. Note that the sputtered TiN film 23 is not vapor deposited to reach the bottom of the hole. Rather, it is vapor deposited only on an upper surface of BPTEOS film 18 and in a vicinity of the opening (FIG. 4).

Figure 5:
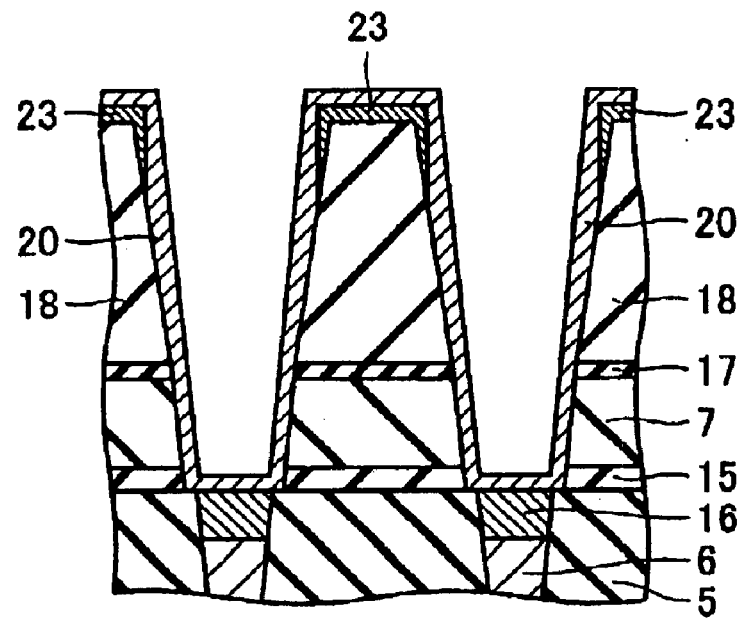
FIG. 5 shows that a ruthenium film of an SN electrode film has been vapor deposited.

Then, with reference to FIG. 5, sputtering is employed to vapor deposit ruthenium to have a thickness of 10 nm. Then, chemical vapor deposition is employed to further vapor deposit ruthenium to provide a ruthenium film 20 uniformly in the opening for the SN (FIG. 5).

Figure 6:
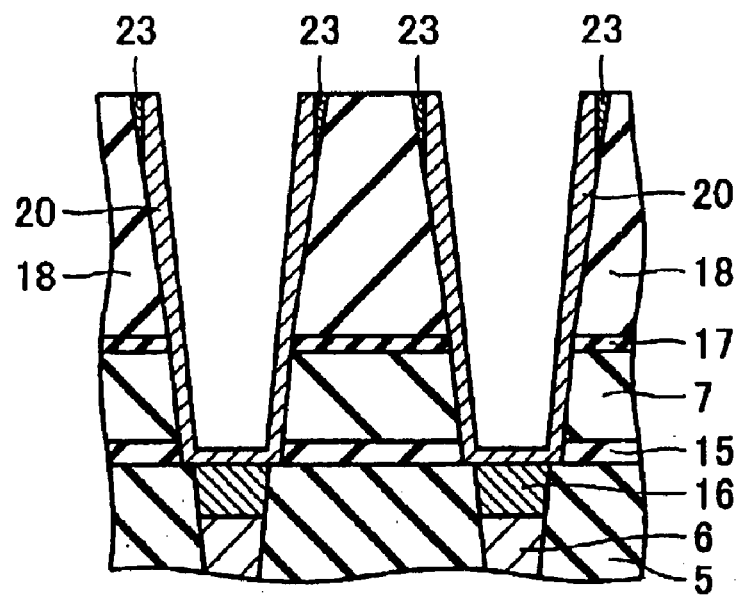
FIG. 6 shows an intermediate product having been chemically mechanically polished.

Then photolithography is employed to bury photoresist in the SN hole and ruthenium film 20 located on an upper surface of SN interlayer oxide film 18 and serving as an SN electrode and TiN film 23 are chemically mechanically polished. Note that ruthenium 20 is in close contact with an upper surface of SN interlayer oxide film 18 via TiN film 23, as shown in FIG. 6, and it does not peel off when it is chemically mechanically polished. After the films are chemically mechanically polished, the resist in the hole is removed (FIG. 6).

Figure 7:
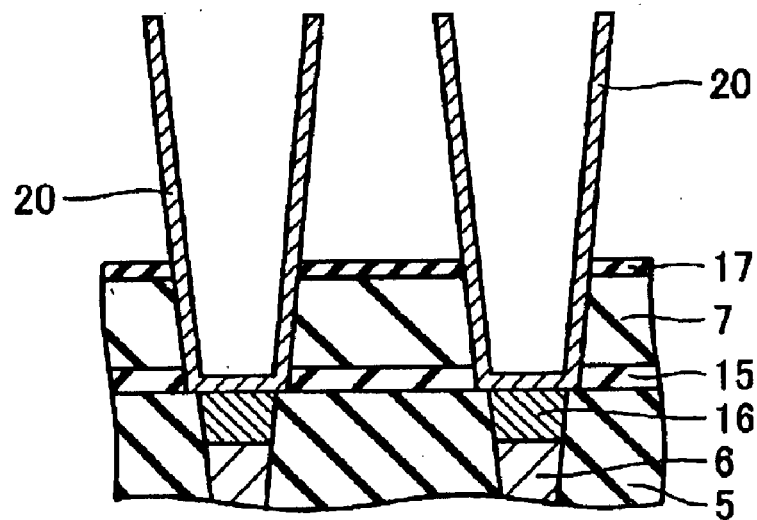
FIG. 7 shows that the BPTEOS film and the sputtered TiN film have been removed.

Then, with reference to FIG. 7, initially a surfactant-containing buffer hydrofluoric acid liquid (BHF-U liquid) is used to etch BPTEOS film 18. At the position of the SiN film of wet stopper film 17 the etching is stopped. An SN cylinder thus protrudes upper than the wet stopper film. As has been described previously, wet stopper film 17 is not limited to SiN film and it may for example be polysilicon film, TiN film or TaN film. Then a liquid of sulfuric acid ($H_2SO_4$) is used to remove TiN film 23 vapor deposited on an outer upper portion of the cylinder and a cylindrical storage node of Ru film is thus formed (FIG. 7). The removal of TiN film 23 can reduce current leakage otherwise attributed to remaining TiN film.

Figure 8:
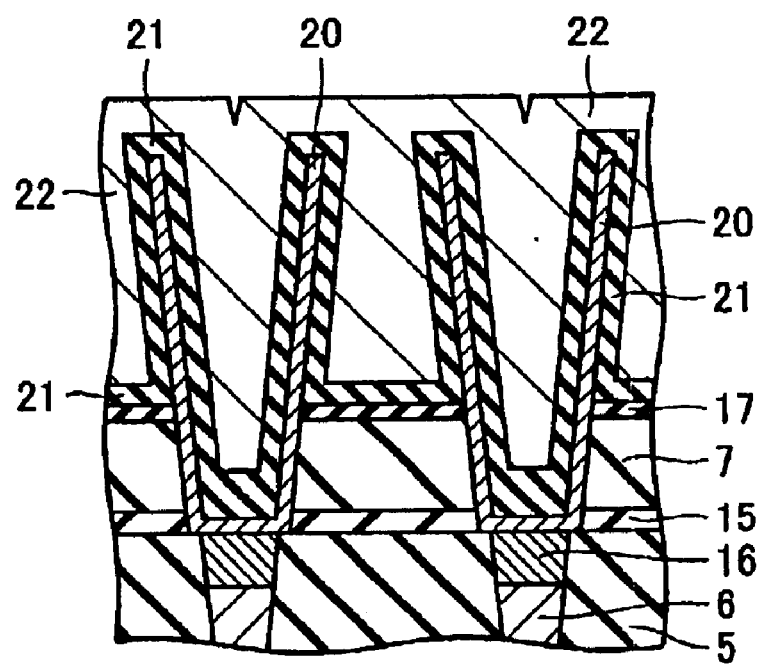
FIG. 8 shows that tantalum oxide film of dielectric film is vapor deposited and a ruthenium film to serve as a cell plate is then vapor deposited.

Then as a dielectric film a tantalum oxide ($Ta_2O_5$) film 21 is vapor deposited to have a thickness of 12 nm and subsequently oxidized at 400° C. in ozone gas and thus crystallized. Note that ruthenium film 20 serving as a storage node's electrode film can be prevented from collapsing, since while ruthenium film 20 has poor contact with BPTEOS film 7, ruthenium film 20 is in good contact with TiN plug 16. Furthermore, the existence of wet stopper SiN film 17 allows SN interlayer insulation film 7 to remain and thus support a lower side of the cylinder to prevent the cylinder from collapsing. Then, as shown in FIG. 8, as cell plate electrode 22 a ruthenium film is vapor deposited to form the cell plate electrode.

Thus the sputtered TiN film 23 vapor deposited after the SN hole is provided can prevent the ruthenium film chemically mechanically polished from peeling off and the SN from varying in geometry. Furthermore, introducing wet stopper film 17 in the SN interlayer insulation film can prevent the cylinder from collapsing.

The above, present semiconductor device is produced by a method using a TiN film as temporary adhesive, including in a widest scope the steps of: forming a storage node contact in a first hole located in a first interlayer insulation film provided on a semiconductor substrate; vapor depositing a second interlayer insulation film on the first interlayer insulation film; and providing a second hole in the second interlayer insulation film at a location corresponding to the storage contact node, the second hole reaching the first interlayer insulation film. The method further includes the steps of: employing sputtering to vapor deposit a TiN film on an upper surface of an insulation film and an opening end of the second hole; after the step of sputtering, vapor depositing a metal film over an entire surface to serve as a storage node; and removing the deposited TiN before vapor depositing a dielectric film in contact with the metal film to serve as the storage node.

As described above, the sputtered and thus formed TiN film serves as adhesive on an upper edge of an opening between an insulation film and a cylindrical metal film. As such, when the cylindrical metal film and the insulation film are chemically mechanically polished and thus removed, the TiN existing at the polished portion and thereunder and bonding the insulation film and the cylindrical metal film together can prevent the cylindrical metal film from collapsing. Furthermore, the TiN film can be removed, which can prevent an increase of current leakage otherwise attributed to the existence of the TiN film.

The above, present semiconductor device is produced by a method with an etching stopper film formation step and an etching and recessing step particularly noted, including in a widest scope the steps of: forming a storage node contact in a first hole provided in a first interlayer insulation film overlying a semiconductor substrate; and stacking on the first interlayer insulation film a second interlayer insulation film, an etching stopper film and an insulation film. The method further includes the steps of: providing a second hole in the second interlayer insulation film, the etching stopper film and the insulation film at a location corresponding to the storage node contact, the second hole reaching the first interlayer insulation film; and after the step of providing the second hole, vapor depositing a TiN film across an entire surface. The method further includes the steps of: after the step of vapor depositing the TiN film, vapor depositing a metal film covering an entire surface to serve as a storage node; chemically mechanically polishing to expose the insulation film and etching the insulation film away to reach the etching stopper film; dry etching the TiN film for example with $Cl_2$ gas to recess the TiN film to have an upper end lower in level than the etching stopper film, and in the step of forming the etching stopper film a SiN film is vapor deposited at no more than 400° C. and in the step of vapor depositing the TiN film across the entire surface the TiN film is vapor deposited through chemical vapor deposition at no more than 600° C.

In this production method an etching stopper film can be deposited at a low temperature so that the storage node contact can be protected from further crystallization and the storage node contact can be prevented from providing increased contact resistance. Furthermore, employing chemical vapor deposition at 600° C. to form the TiN film can improve the TiN film's coverage.

Second Embodiment

In the first embodiment the SN hole (the second hole) is provided by etching and the sputtered TiN film 23 is thereafter vapor deposited to allow subsequently stacked ruthenium film 20 and SN interlayer insulation film 18 to have enhanced contact with each other. The present invention in a second embodiment is characterized in that a TiN film is used as a hard mask to allow a ruthenium film to have enhanced contact.

In the second embodiment a production method is provided, as described hereinafter. Initially as an SC interlayer insulation film (a first interlayer insulation film) 5 a BPTEOS film is vapor deposited to have a thickness of 450 nm and a photoresist pattern is used as a mask to pattern the BPTEOS film. Then, dry etching is employed to etch an oxide film of an opening (a first hole) for the SC. Then, doped polysilicon is vapor deposited to have a thickness of 200 nm and etched back and thus recessed by 100 nm to form a polycrystalline silicon plug 5. Then as an SC barrier metal 16 a film formed of a stack of TiN/Ti is provided through chemical vapor deposition and then chemically mechanically polished. The above process steps are similar to those described in the first embodiment with reference to FIG. 2.

Figure 9:
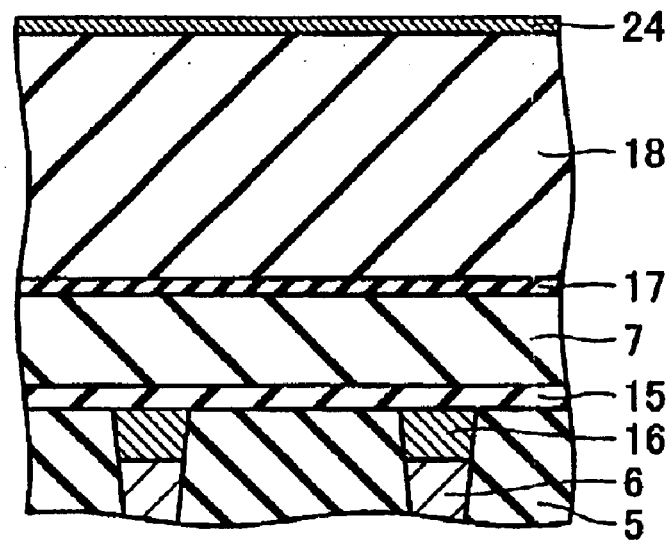
FIG. 9 shows that in production of a semiconductor device of a second embodiment of the present invention a wet stopper film, a BPTEOS film and a TiN film have been vapor-deposited, as seen in cross section.

Then reference will be made to FIGS. 9 to 12 to describe subsequent steps of the present method. As shown in FIG. 9, as an SN interlayer insulation film (a second interlayer insulation film) 7 a BPTEOS film is vapor deposited to have a thickness of 400 nm. Furthermore for a wet stopper film 17 a SiN film is vapor deposited to have a thickness of 15 nm and thereon a BPTEOS film 18 is vapor deposited to have a thickness of 800 nm. Then a TiN film 24 to be used for a hard mask is vapor deposited by sputtering to have a thickness of 100 nm.

Figure 10:
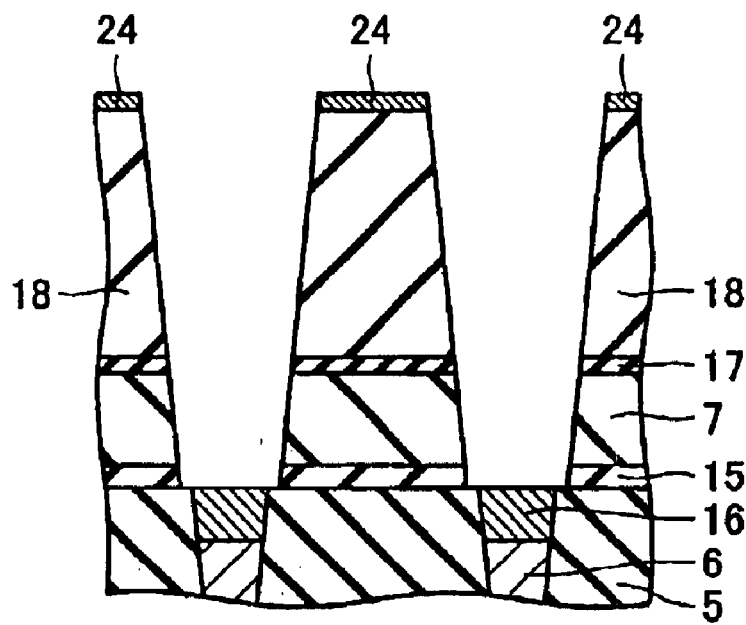
FIG. 10 shows that the TiN film that has been patterned is used as a hard mask to pattern an SiN film, an SN interlayer insulation film, the wet stopper film and the BPTEOS film.

Then, with a photoresist pattern used as a mask, TiN film 24 is dry etched and thus patterned. The patterned TiN film is used as a hard mask to dry etch an oxide film of an opening (a second hole) of the SN, as shown in FIG. 10. Thus, enhanced resistance to etching can be held and the opening can have an improved geometry than when a photoresist pattern is used as a mask.

Figure 11:
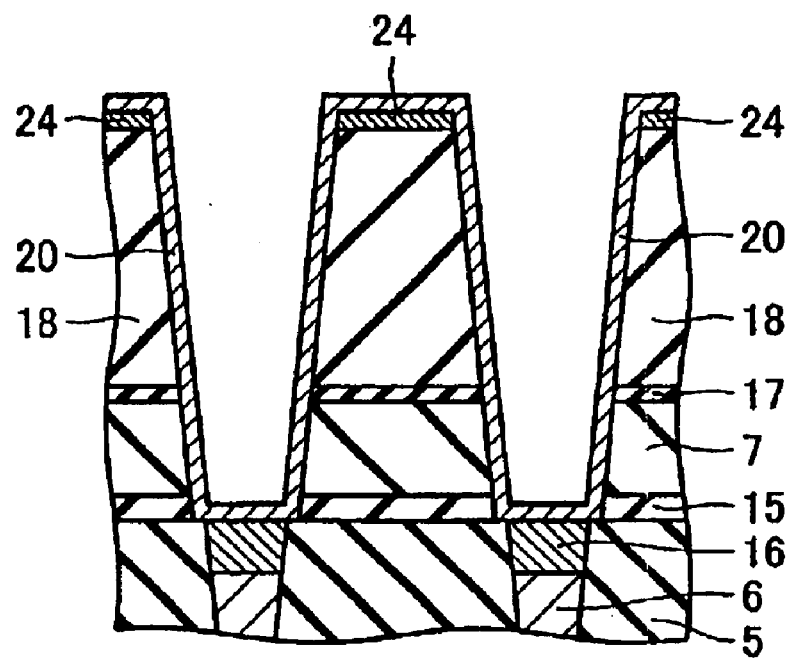
FIG. 11 shows that a ruthenium film to serve as an SN electrode has been vapor deposited.

Sputtering is then employed to vapor deposit a ruthenium film to have a thickness of 10 nm and chemical vapor deposition is then employed to further vapor deposit ruthenium film. As shown in FIG. 11, ruthenium film 20 of a bottom electrode of a capacitor can be vapor deposited in an SN hole uniformly.

Figure 12:
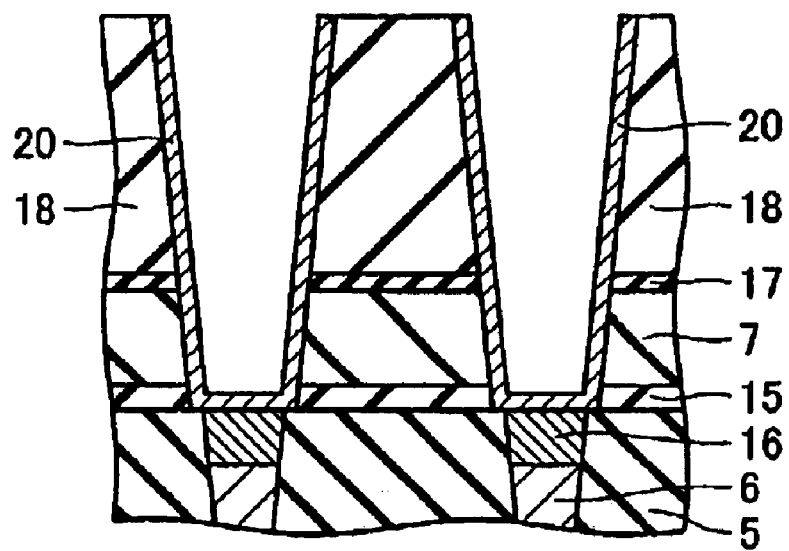
FIG. 12 shows an intermediate product having been chemically mechanically polished.

Photolithography is then employed to bury photoresist in the SN hole and ruthenium film 20 and TiN film 24 covering an upper surface of SN interlayer oxide film 18 are chemically mechanically polished. Note that ruthenium film 20 chemically mechanically polished can be prevented from peel off as it is in close contact with an upper surface of SN interlayer oxide film 18 via TiN film 24. After the films are CMPed, the resist in the opening for the SN is removed (FIG. 12).

BHF-U liquid is then used to etch BPTEOS film 18 away until wet stopper film 17 is reached. Subsequently as a dielectric film 21 tantalum oxide ($Ta_2O_5$) is vapor deposited to have a thickness of 12 nm and subsequently at 500° C. in ozone gas it is oxidized and thus crystallized. While the ruthenium film of SN electrode film 20 is in poor contact with BPTEOS film 7, ruthenium film 20 is in good contact with TiN plug 16 and does not collapse. Furthermore the existence of wet stopper SiN film 17 can prevent the cylinder from collapsing. Subsequently as a CP electrode a ruthenium film 22 is vapor deposited to form a cell plate electrode (FIG. 8).

Thus introducing a wet stopper film in the SN interlayer insulation film can prevent the cylinder from collapsing. Furthermore, using a TiN film as a hard mask allows greater resistance to etching and a better geometry of an etched opening than using a resist pattern as a mask in etching an SN hole. Furthermore after the SN hole is provided a TiN film may be vapor deposited by sputtering on an upper edge of the opening so that the sputtered TiN film can prevent a ruthenium film chemically mechanically polished from peeling off and thus prevent the SN from varying in geometry.

The above semiconductor device is produced in a method including in a widest scope the steps of: forming a storage node contact in a first hole existing in a first interlayer insulation film overlying a semiconductor substrate; and vapor depositing a second interlayer insulation film on the first interlayer insulation film and furthermore employing sputtering to stack a TiN film on the second interlayer insulation film. The method further includes the steps of: patterning the TiN film; using the patterned TiN film as a hard mask, dry etching to provide a second hole in the second interlayer insulation film at a location corresponding to the storage node contact, the second hole reaching the first interlayer insulation film; and after the step of providing the second hole, vapor depositing a metal film across an entire surface to serve as a storage node.

Thus using a TiN film as a hard mask for dry etching to provide a second hole for a storage node, allows greater resistance to etching and a better geometry of the etched hole than using a resist mask.

Third Embodiment

The present invention in a third embodiment provides a semiconductor device characterized in that before a ruthenium film to serve as an SN electrode is vapor deposited, CVD is employed to vapor deposit a TiN film and the SN electrode's underlying film is vapor deposited and a ruthenium film is then vapor deposited to form the SN electrode to have a 2-layer structure.

Figure 13:
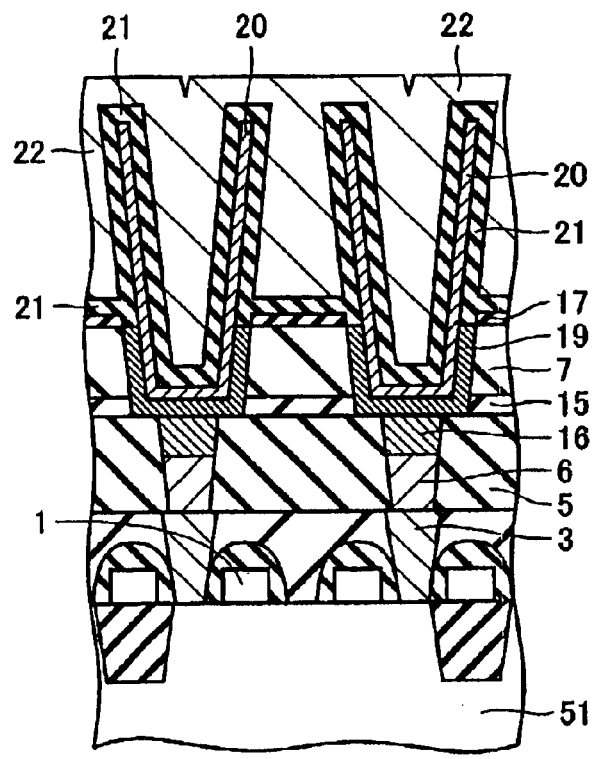
FIG. 13 is a cross section of a semiconductor device of a third embodiment of the present invention.

FIG. 13 is a cross section of a 2-layer MIM capacitor of an SN electrode of the semiconductor device of the present embodiment. This semiconductor device is similar to the FIG. 1 semiconductor device except that a CVD-TiN film 19 is arranged at a lower portion the SN electrode for bonding a ruthenium film and thereon ruthenium film 20 of an SN electrode film is arranged.

Reference will now be made to FIGS. 14–22 to describe a method of producing the semiconductor device of the present embodiment.

Figure 14:
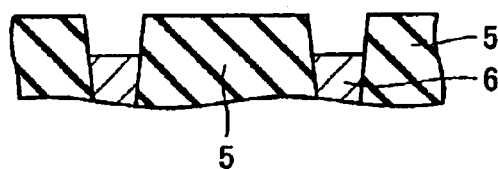
FIG. 14 shows that in production of the FIG. 13 semiconductor device an SC hole is internally provided with a polycrystalline silicon plug.

Initially as an SC interlayer insulation film (a first interlayer insulation film) 5 a BPTEOS film is vapor deposited to have a thickness of 450 nm and a photoresist pattern is used as a mask to pattern the BPTEOS film. Then, dry etching is employed to etch an oxide film of an SC hole (a first hole). Then, doped polysilicon is vapor deposited to have a thickness of 200 nm and then etched back and thus recessed by 100 nm to form a polycrystalline silicon plug (SC) 6 (FIG. 14).

Figure 15:
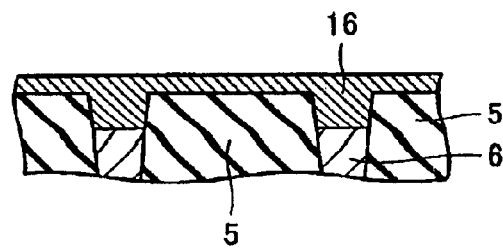
FIG. 15 shows that an SC barrier metal has been deposited.
Figure 16:
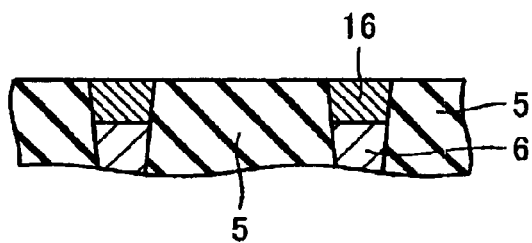
FIG. 16 shows an intermediate product having been chemically mechanically polished.

Then, as shown in FIG. 15, as an SC barrier metal 16 a film formed of TiN/Ti stacked is deposited through chemical vapor deposition and this interlayer structure film is then chemically mechanically polished, as shown in FIG. 16, to form an SC barrier metal plug.

Figure 17:
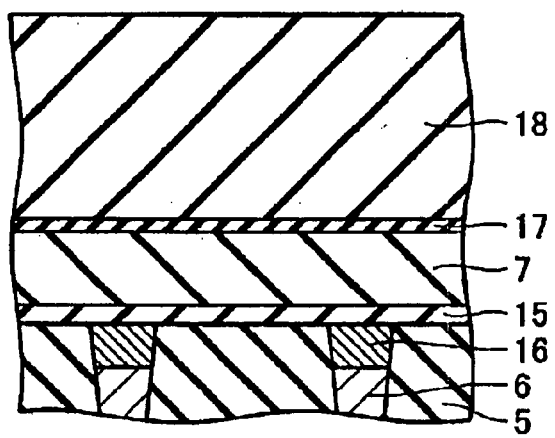
FIG. 17 shows that an SiN film, an SN interlayer insulation film, a wet stopper film and a BPTEOS film have further been formed.
Figure 18:
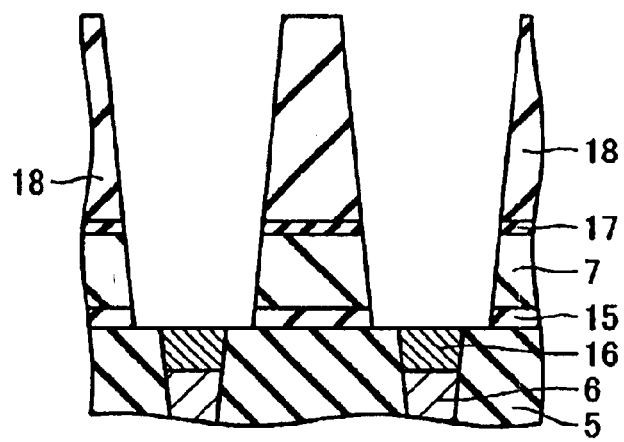
FIG. 18 shows that an SN hole has been provided.

Then, with reference FIG. 17, as SN interlayer insulation film (the second interlayer insulation film) 7 a BPTEOS film is vapor deposited to have a thickness of 400 nm and then for wet stopper film 17 a SiN film is vapor deposited to have a thickness of 15 nm. Thereon BPTEOS film 18 is vapor deposited to have a thickness of 800 nm. Then a photoresist pattern is used as a mask to pattern SN interlayer insulation film 7, wet stopper film 17 and BPTEOS film 18. Then dry etching is employed to etch an oxide film of an SN hole (a second hole) (FIG. 18).

Figure 19:
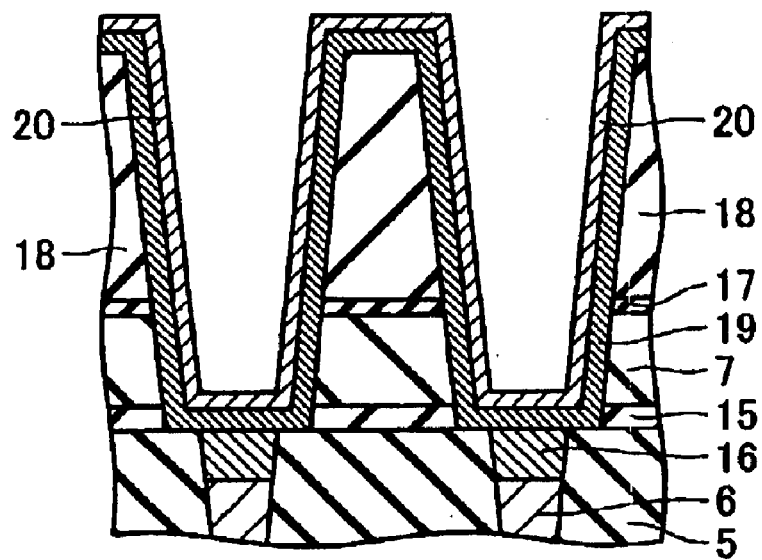
FIG. 19 shows that a TiN film serving as an underlying film of an SN electrode and a Ru film of an electrode film have been vapor deposited.

Then by chemical vapor deposition at 600° C. a TiN film 19 is vapor deposited to have a thickness of 20 nm. The vapor deposition of the TiN film at 600° C. or less can improve the TiN film's coverage. Sputtering is then employed to vapor deposit a ruthenium film to have a thickness of 10 nm. Furthermore, chemical vapor deposition is employed to vapor deposit a ruthenium film. Ruthenium film 20 can thus be vapor deposited in the SN hole uniformly. As a result, a ruthenium film/TiN film, 2-layer film is formed, as shown in FIG. 19.

Figure 20:
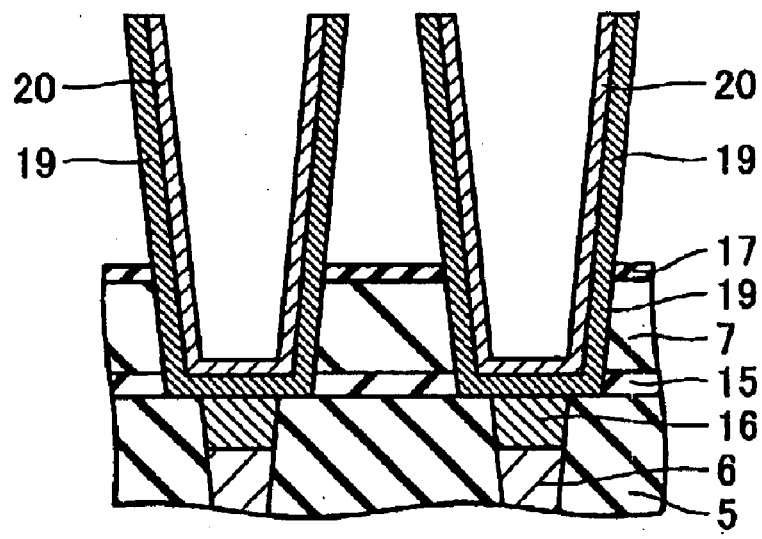
FIG. 20 shows that after chemically mechanically polishing, a BPTEOS film has been removed.

Photolithography is then employed to bury photoresist in the SN hole and ruthenium film 20 and SN interlayer oxide film 18 is CMPed together with ruthenium film 20 and TiN film 19 covering an upper surface of SN interlayer oxide film 18. Note that ruthenium film 20 chemically mechanically polished can be prevented from peel off as it is in close contact with an upper surface of SN interlayer oxide film 18 via TiN film 19. After the films are CMPed, the resist in the hole is removed. BHF-U liquid is then used to etch BPTEOS film 18 serving as an SN interlayer insulation film. Note that the etching stops at SiN film 17 serving as a wet stopper. This can also be done similarly in dry-etching an oxide film. FIG. 20 shows that the SN interlayer insulation film has been etched.

Figure 21:
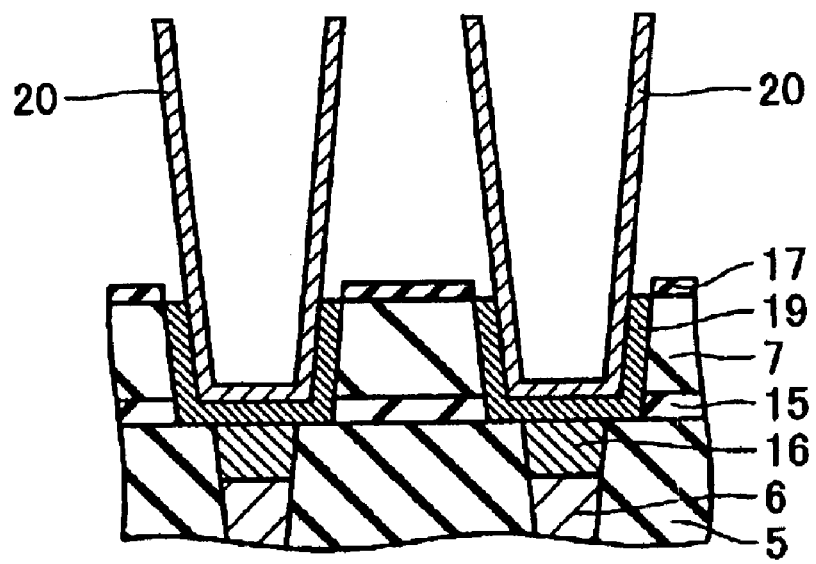
FIG. 21 shows that the underlying TiN film is etched and thus recessed.

TiN film 19 is then etched by a thickness of 20 nm and thus recessed by 20 nm as compared with the height of the SiN film corresponding to wet stopper film 17. It may be recessed by dry etching using a gas of $Cl_2$ or wet etching using sulfuric acid or hydrogen peroxide solution, although dry etching is preferable as it does not provide permeation into BPTEOS film 7, as introduced in wet etching. The dry etching using the gas of $Cl_2$ can completely prevent permeation introduced by etching to provide a recess by wet etching. A cylindrical capacitor of Ru film can thus be formed and the cylinder has an outer, circumferential TiN film removed. FIG. 21 shows that the TiN film has been etched and thus recessed.

Figure 22:
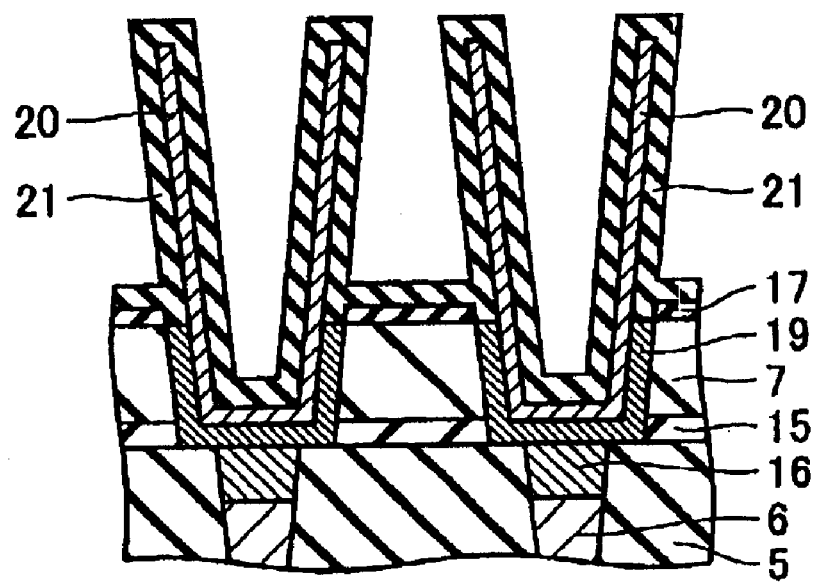
FIG. 22 shows that a dielectric film has been vapor deposited.

Then, as shown in FIG. 22, as a dielectric film a tantalum oxide film 21 is vapor deposited to have a thickness of 12 nm and then oxidized at 400° C. in ozone gas and thus crystallized. In doing so, the ruthenium film of SN electrode film 20 is in close contact with the BPTEOS film of SN interlayer insulation film 7 via TiN film 19 and furthermore ruthenium film 20 is in good, close contact with TiN plug 16. This can prevent them from having a gap therebetween or peeling off and the cylinder from collapsing.

Then as cell plate electrode 22 a ruthenium film is vapor deposited and then etched to form the cell plate electrode. As a result, as has been shown in FIG. 13, a product obtained after the cell plate electrode is formed is provided.

Forming the SN electrode to have a ruthenium film/TiN film, 2-layer structure, as described above, can prevent the ruthenium film chemically mechanically polished from peeing off and the SN from varying in geometry, which as a result can prevent the cylinder from collapsing. Furthermore, recessing TiN film 19 by 20 nm as compared with the height of wet stopper SiN film 17 can reduce a current leaking and flowing from TiN film 19 through dielectric film 21 to ruthenium film 22 of the cell plate electrode.

Fourth Embodiment

Figure 23:
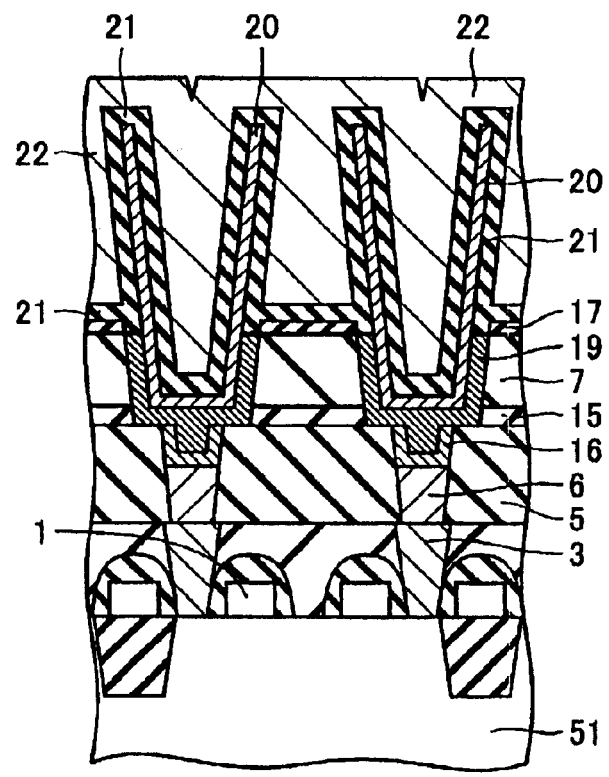
FIG. 23 is a cross section of a semiconductor device of a fourth embodiment of the present invention.

FIG. 23 shows a semiconductor device of a fourth embodiment of the present invention. The present embodiment is characterized in that an MIM capacitor having a 2-layer structure forming an SN electrode has a recessed structure of TaN barrier metal. More specifically, TiN barrier metal 16 in contact with TiN 19 of an underlying film located at a bottom of the SN electrode in the third embodiment, is formed to have a recessed structure of TaN barrier metal. This recessed structure of TaN barrier metal 16 can prevent the cylinder from collapsing, protect the barrier metal from against oxidation, and prevent contact resistance from decreasing.

In FIG. 23 it is characterized in that a TaN film forming an upper portion 16 of an SC plug is recessed at the bottom of the SN electrode and underlying film 19 of a 2-layer film configuring the SN electrode thereon is formed using TiN film. The remainder is similar to that of the semiconductor device shown in FIG. 13.

Figure 24:
FIG. 24 shows that in production of the FIG. 23 semiconductor device in an SC hole polycrystalline silicon is vapor deposited.

Reference will now be made to FIGS. 24–32 to describe a method of producing the semiconductor device in the present embodiment. With reference to FIG. 24, initially as an SC interlayer insulation film (a first interlayer insulation film) 5 a BPTEOS film is vapor deposited to have a thickness of 450 nm and a photoresist pattern is used as a mask to pattern the BPTEOS film. Then, dry etching is employed to etch an oxide film of an SC hole (a first hole). Then, doped polysilicon is vapor deposited to have a thickness of 200 nm and then etched back and thus recessed by 100 nm to form an SC polycrystalline silicon plug 6 (FIG. 24).

Figure 25:
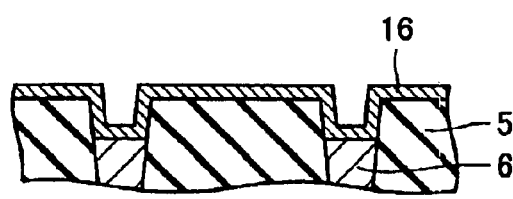
FIG. 25 shows that an SC barrier metal's TaN film is formed in the SC hole to have a recessed geometry.
Figure 26:
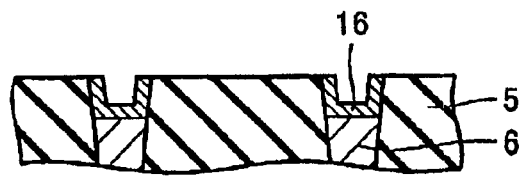
FIG. 26 shows an intermediate product having been chemically mechanically polished.

Then, with reference to FIG. 25, as SC barrier metal 16 TaN film is vapor deposited by sputtering to have a thickness of 35 nm. As TaN film is vapor deposited by sputtering to have a thickness of 35 nm, it is vapor deposited in the SC hole on an internal wall. As such, the deposited TaN film has a recessed geometry. Then, as shown in FIG. 26, TaN film 16 is chemically mechanically polished. Note that the film is chemically mechanically polished within a range allowing the film to have a recessed geometry.

The SC barrier metal's TaN film having a recessed geometry can be in contact with subsequently vapor deposited TiN film 19 over an increased area to advantageously achieve reduced contact resistance. Furthermore, it can be in contact with the SN electrode's underlying TiN film 19 over a large area, and TiN film and TaN film can be in good, close contact with each other, which can effectively prevent the cylinder from collapsing.

Figure 27:
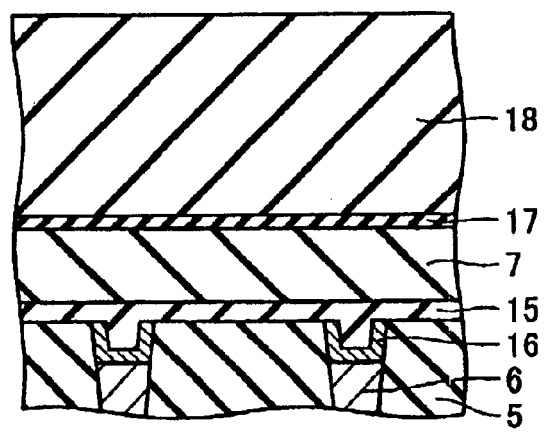
FIG. 27 shows that an SiN film, an SN interlayer insulation film, a wet stopper film and a BPTEOS film have further been formed.
Figure 28:
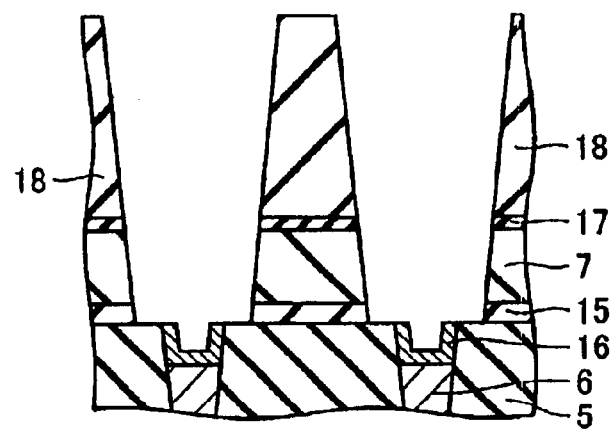
FIG. 28 shows that an SN hole has been provided.

Then, with reference FIG. 27, as SN interlayer insulation film (the second interlayer insulation film) 7 a BPTEOS film is vapor deposited to have a thickness of 400 nm and then for wet stopper film 17 a SiN film is vapor deposited to have a thickness of 15 nm. Thereon BPTEOS film 18 is vapor deposited to have a thickness of 800 nm. Then a photoresist pattern is used as a mask to pattern the BPTEOS film. Then dry etching is employed to etch an oxide film of an SN hole (a second hole). FIG. 28 shows an intermediate product with the SN hole's oxide film having been etched.

Figure 29:
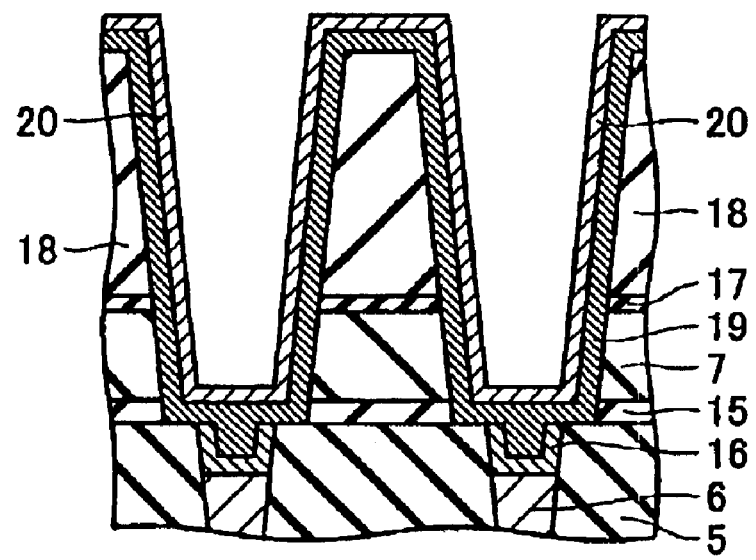
FIG. 29 shows that a TiN film corresponding to an underlying film of an SN electrode is vapor deposited and thereon a Ru film of an electrode film is further vapor deposited.

Then chemical vapor deposition is employed to vapor deposit a TiN film 19. Sputtering is then employed to vapor deposit a ruthenium film to have a thickness of 10 nm. Furthermore, chemical vapor deposition is employed to vapor deposit a ruthenium film. Ruthenium film 20 can thus be vapor deposited in the SN hole uniformly. FIG. 29 shows an intermediate product with a ruthenium film 20/TiN film 19, 2-layer film having been vapor deposited.

Figure 30:
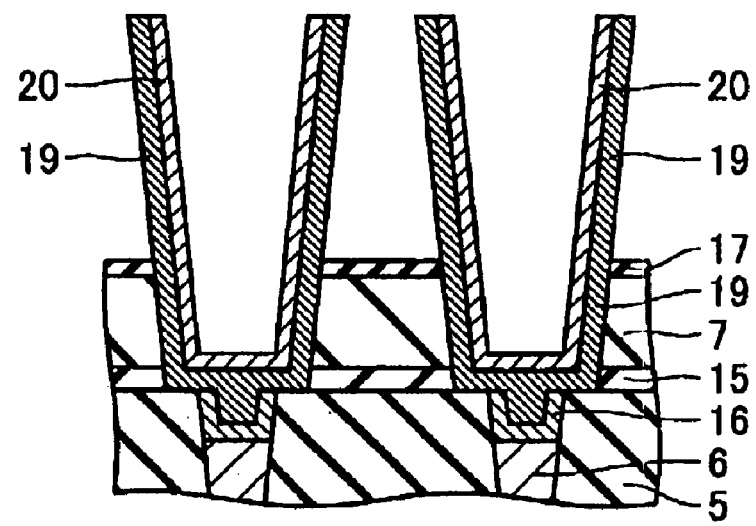
FIG. 30 shows that after chemically mechanically polishing, BPTEOS has been etched.

Photolithography is then employed to bury photoresist in the SN hole and ruthenium film 20 and TiN film 19 covering an upper surface of SN interlayer oxide film 18 is CMPed. Note that ruthenium film 20 chemically mechanically polished can be prevented from peel off as it is in close contact with an upper surface of SN interlayer oxide film 18 via TiN film 19. After the films are CMPed, the resist in the SN hole is removed. BHF-U liquid is then used to etch BPTEOS film 18 of the SN interlayer insulation film. Note that the etching stops at the SiN film of wet stopper film 17 (FIG. 30). This can also be done similarly in dry-etching an oxide film.

Figure 31:
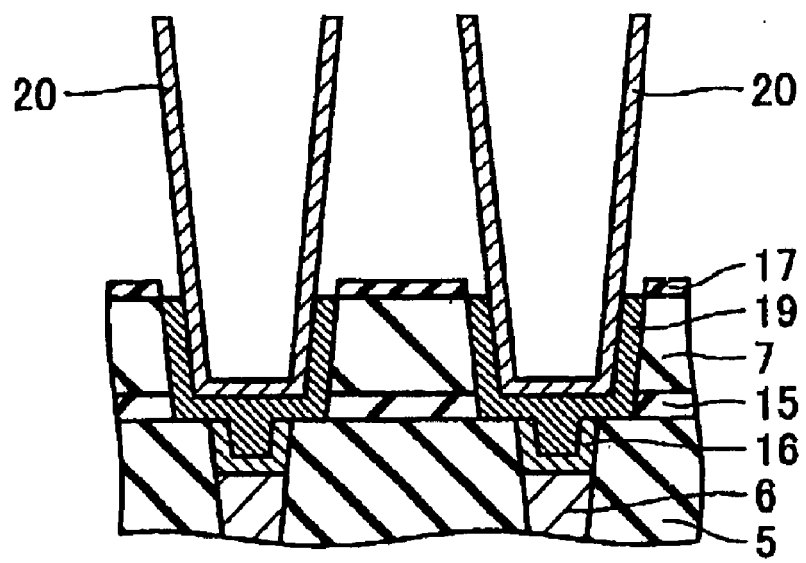
FIG. 31 shows that the underlying TiN film has been etched and thus recessed.

Subsequently, sulfuric acid or hydrogen peroxide solution is used to etch and thus recess TiN film 19 by 20 nm as compared with the height of SiN film 17. A cylindrical capacitor of ruthenium film can thus be completed and the cylinder has an outer peripheral TiN film removed. FIG. 31 shows that the TiN film forming underlying film 19 of the SN electrode has been etched and thus recessed.

Figure 32:
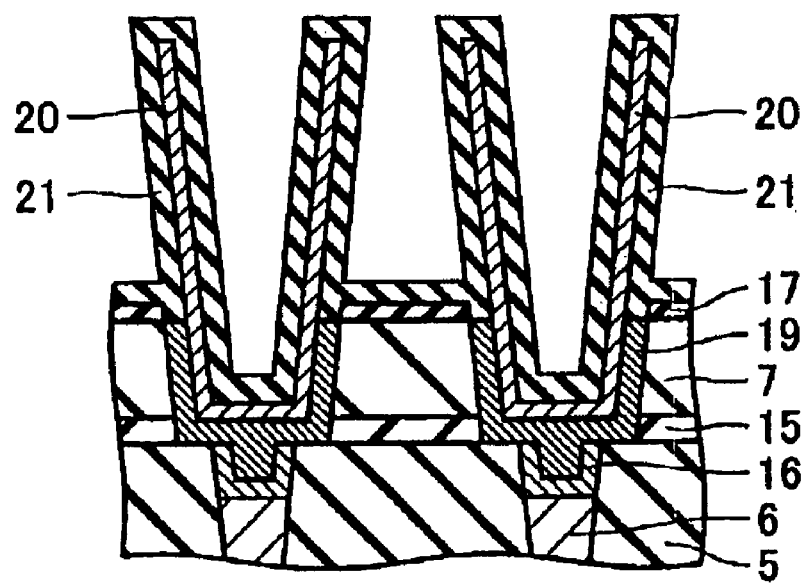
FIG. 32 shows that a dielectric film has been vapor deposited.
Figure 33:
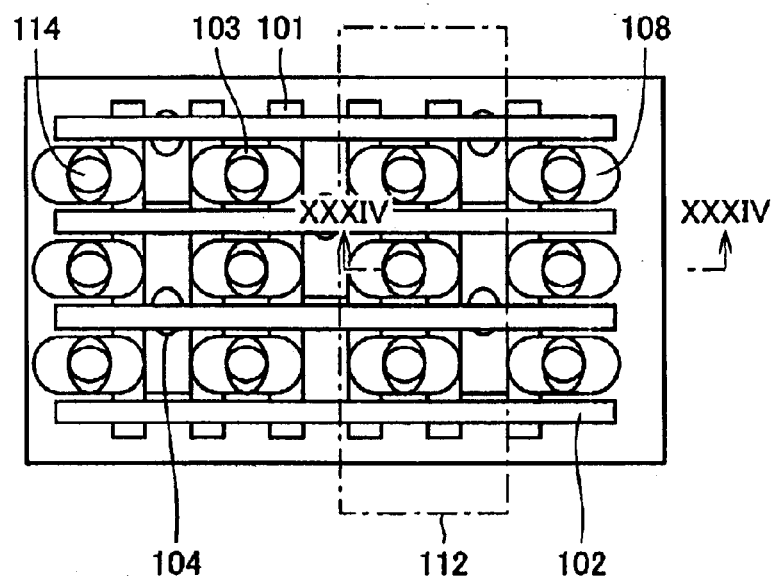
FIG. 33 is a plan view of a conventional semiconductor device.
Figure 34:
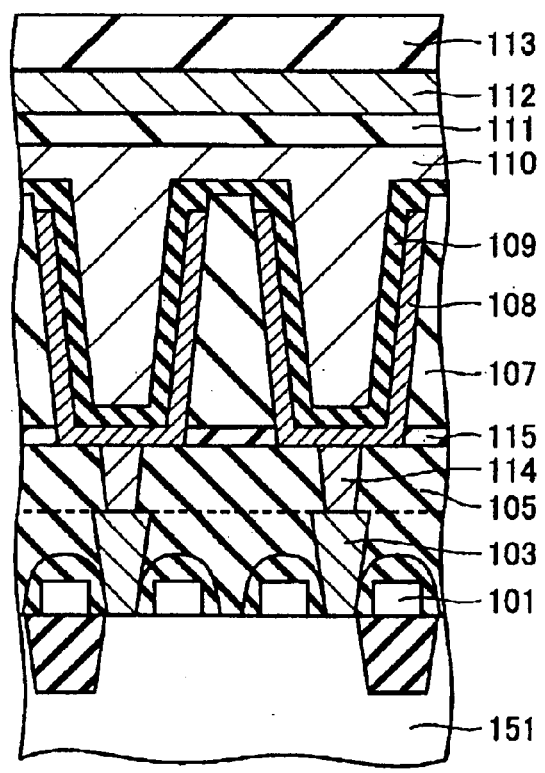
FIG. 34 is a cross section taken along a line XXXIV—XXXIV of FIG. 33.
Figure 35:
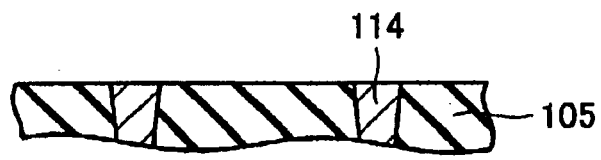
FIG. 35 shows that in production of the FIG. 34 semiconductor device an SC hole is internally provided with barrier metal.
Figure 36:
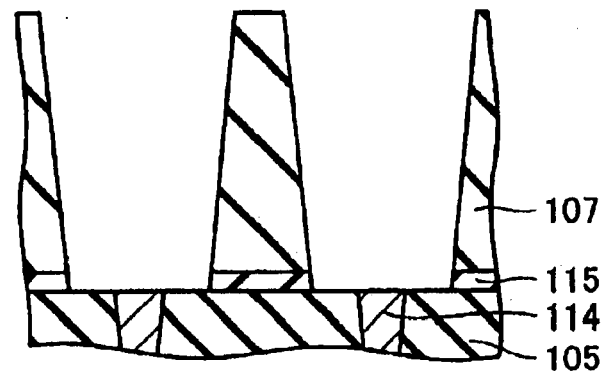
FIG. 36 shows that an SiN film and an SN interlayer insulation film are vapor deposited and etching is then employed to provide an SN hole.
Figure 37:
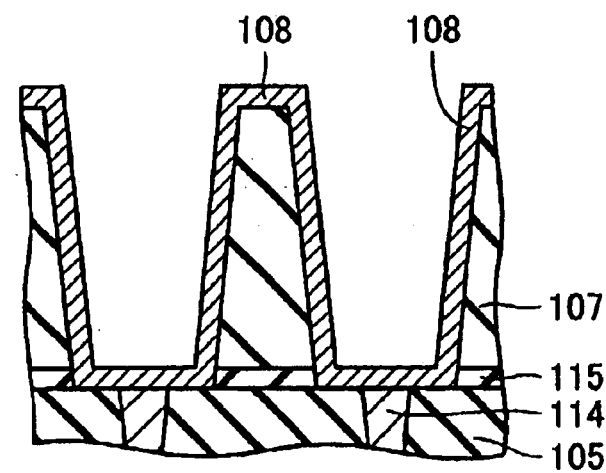
FIG. 37 shows that a Ru film of an SN electrode film has been vapor deposited.
Figure 38:
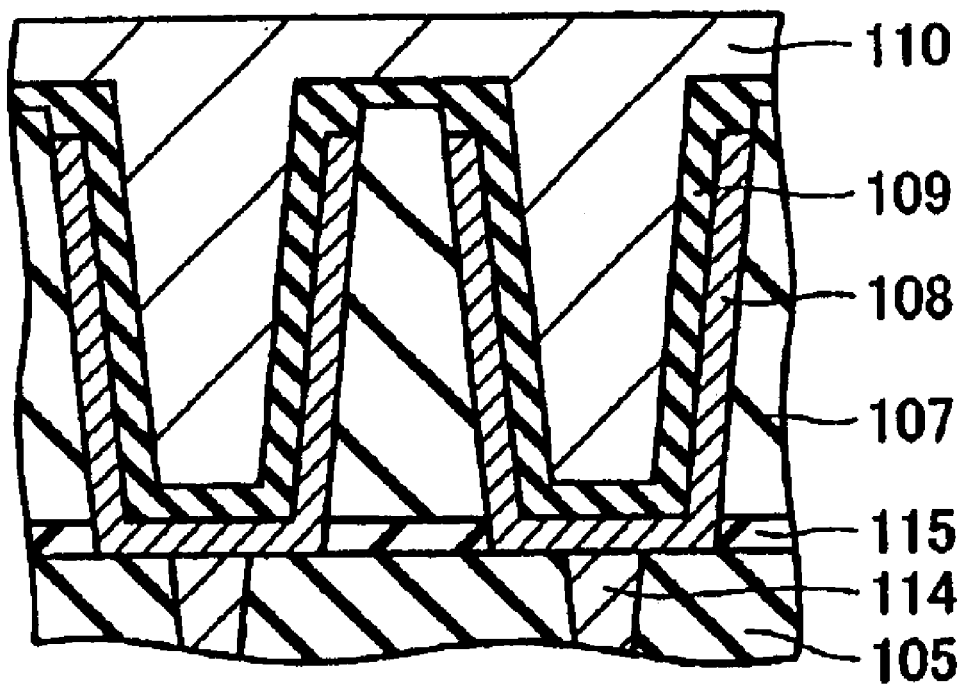
FIG. 38 shows that after chemically mechanically polishing, a dielectric film has been vapor deposited and a Ru film of a cell plate electrode has been vapor deposited.

Then, as shown in FIG. 32, as a dielectric film a tantalum oxide film 21 is vapor deposited to have a thickness of 12 nm and then oxidized at 400° C. in ozone gas and thus crystallized. In doing so, the ruthenium film of SN electrode film 20 is in close contact with the BPTEOS film of SN interlayer insulation film 7 via TiN film 19. Furthermore, ruthenium film 20 has a bottom in close contact with recessed TaN plug 16 via TiN film 19. These films are in good, close contact with each other and thus prevented from having a gap therebetween or peeling off to cause the cylinder to collapse.

Furthermore, when the tantalum oxide forming dielectric film 21 is oxidized in ozone the ozone's oxidizing species is blocked by the TaN film of SC barrier metal 16. As such, polycrystalline silicon plug 16 and SC barrier metal 16 can have their interface free of oxidation to prevent a contact resistance from increasing. Then, as has been shown in FIG. 23, as a cell plate electrode a ruthenium film 22 is vapor deposited to form the cell plate electrode.

As described above, the SN electrode film's ruthenium film 20 can be in satisfactorily close contact with BPTEOS film 7 via TiN film 19 and with the TaN film of SC barrier plug 16 via TiN film 19 and thus prevented from having a gap or peeling off to cause SN electrode's cylinder to collapse.

Furthermore, recessing TiN film 19 by 20 nm as compared with the height of wet stopper SiN film 17 can reduce a current leaking and flowing from TiN film 19 of underlying film 19 of the SN electrode through dielectric film 21 to ruthenium film 22 of the cell plate electrode.

Furthermore, the TaN film of SC barrier plug 16 that has a recessed structure can contact the TiN film of underlying film 19 of the SN electrode over an increased area to prevent the cylinder from collapsing and also allows reduced contact resistance. Furthermore, using sputtered TiN film for SC barrier plug 16 can prevent oxidation of SC polycrystalline silicon film 6 and associated reduction of contact resistance when dielectric film 21 is oxidized in ozone.

The present invention in another aspect provides a method of producing a semiconductor device including the step of sputtering to form a TaN film as a top end portion of a storage node contact in a first hole located in a first interlayer insulation film overlying a semiconductor substrate, the TaN film being recessed, as seen downwards. Furthermore, the present method further includes the steps of: vapor depositing a second interlayer insulation film on the first interlayer insulation film; and forming in the second interlayer insulation film at a location corresponding the storage node contact a second hole reaching the first interlayer insulation film to expose the TaN film recessed as seen downward. Furthermore the method includes after the step of forming the second hole the steps of employing chemical vapor deposition to vapor deposit TiN film across an entire surface; and subsequently vapor depositing a metal film across an entire surface to serve as the storage node.

In the present method the TiN film serving as adhesive for the cylindrical metal film and the storage node contact can be in contact with each other over an increased area. As such the storage node contact's resistance can be reduced. Furthermore the increased contact area can provide enhanced contact to prevent the cylindrical metal film from collapsing.

Additional Comments on the Embodiments

1. While in the above embodiments an etching stopper (wet stopper) film has been provided by way of example, the stopper may be eliminated in accordance with the scope of the claims. For example, if the SC barrier metal is formed of a recessed TaN film, the etching stopper film may be dispensed with. Accordingly, the SN hole (the second hole) is formed in the SN interlayer insulation film (the second interlayer insulation film).

2. In addition to the presence/absence of the above etching stopper film, (a1) the sputtered TiN film serving as adhesive, (a2) the TiN film used as a hard mask, (a3) using TiN film or TaN film to form CVDed TiN film used as an underlying film or a portion that contacts the cylindrical metal film of the SC barrier metal, and (a4) the SC barrier metal's recessed TaN or TiN film, as illustrated in the present embodiments, may be combined, as appropriate.

3. While for the cylindrical metal film, i.e., the storage node, only ruthenium film has been used, it may be other metal films. For example, the ruthenium film may be replaced with platinum film, tungsten film or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a first interlayer insulation film disposed on a semiconductor substrate;
   a second interlayer insulation film disposed on said first interlayer insulation film;
   a cylindrical metal film penetrating said second interlayer insulation film, said cylindrical metal film having a bottom facing downward and exposed to the layer of said first interlayer insulation film, said cylindrical metal film having an opening, as seen downward, and extending from said second interlayer insulation film upward; and
   a storage node contact, in contact with said bottom of said cylindrical metal film, disposed in said first interlayer insulation film, said storage node contact being recessed toward said bottom of said cylindrical metal film, said bottom having a protruding geometry embedded in said recess.

2. The semiconductor device according to claim 1, wherein said storage node contact has a portion contacting said cylindrical metal film and formed of TaN.

3. The semiconductor device according to claim 1, wherein said cylindrical metal film has a cylindrical outer surface covered with TiN film formed by chemical vapor deposition and wherein said TiN film is disposed between said cylindrical metal film, and said first and second interlayer insulation films and said storage node contact.

4. A semiconductor device comprising:
   a first interlayer insulation film disposed on a semiconductor substrate;
   a second interlayer insulation film disposed on said first interlayer insulation film;
   an etching stopper film disposed in contact with an upper surface of said second interlayer insulation film;
   a cylindrical metal film penetrating said second interlayer insulation film and said etching stopper film, said cylindrical metal film having a cylindrical bottom facing downward and an opening facing upward, said cylindrical metal film extending from said etching stopper film upward;
   a storage node contact, in contact with said bottom of said cylindrical metal film, disposed in said first interlayer insulation film; and
   a dielectric film covering a cylindrical inner surface of said cylindrical metal film and an outer surface of a portion protruding from said etching stopper film, said etching stopper film being SiN film vapor deposited at no more than 400° C.

5. The semiconductor device according to claim 4, wherein said cylindrical metal film has a cylindrical outer surface covered with TiN film formed by chemical vapor deposition at 600° C. and wherein said TiN film is disposed between said cylindrical metal film, and said first and second interlayer insulation films and said storage node contact.

6. The semiconductor device according to claim 5, wherein said TiN film is dry etched to be recessed to have a position limited to a range lower than said etching stopper film.

* * * * *